(12) United States Patent
Wu et al.

(10) Patent No.: US 7,312,599 B2
(45) Date of Patent: Dec. 25, 2007

(54) BUCK CONVERTER

(75) Inventors: Yung-Lu Wu, Taipei (TW); Wen-Chun Shen, Taipei (TW); Chien-Yao Chen, San Chung (TW)

(73) Assignee: Quanta Computer Inc., Tao Yuan Shien (TW)

( * ) Notice: Subject to any disclaimer, the term of this patent is extended or adjusted under 35 U.S.C. 154(b) by 118 days.

(21) Appl. No.: 11/256,408

(22) Filed: Oct. 21, 2005

(65) Prior Publication Data

US 2006/0125456 A1   Jun. 15, 2006

(30) Foreign Application Priority Data

Dec. 9, 2004   (TW) .............................. 93138184 A

(51) Int. Cl.
*G05F 1/00* (2006.01)
(52) U.S. Cl. .................................................... 323/282
(58) Field of Classification Search ................ 323/283, 323/222, 282, 284
See application file for complete search history.

(56) References Cited

U.S. PATENT DOCUMENTS 5,731,694 A * 3/1998 Wilcox et al. .............. 323/287
6,166,528 A * 12/2000 Rossetti et al. ............. 323/283
6,246,220 B1 * 6/2001 Isham et al. ................ 323/224
6,414,469 B1 * 7/2002 Zhou et al. ................. 323/272
6,462,963 B1 * 10/2002 Wittenbreder ................ 363/16
6,529,536 B1 * 3/2003 Taguchi .................... 372/38.07
6,747,442 B2 * 6/2004 Olsen et al. ................ 323/283

* cited by examiner

*Primary Examiner*—Bao Q. Vu
*Assistant Examiner*—Nguyen Tran
(74) *Attorney, Agent, or Firm*—Thomas, Kayden, Horstemeyer & Risley

(57) ABSTRACT

A buck converter includes a first transistor, a second transistor, a filter circuit, a capacitor and a switch. The first transistor has a drain for receiving a first DC voltage, a gate for receiving a first control signal, and a source coupled to a node. The second transistor has a drain coupled to the node, a gate for receiving a second control signal, and a source coupled to a constant voltage. The filter circuit is electrically coupled to the node for outputting a second DC voltage. The switch has a first terminal electrically coupled to the gate of the second transistor via the capacitor, a second terminal electrically coupled to the source of the second transistor, and a control terminal for receiving the first control signal. The switch has a faster switching speed than the first transistor.

3 Claims, 3 Drawing Sheets

BUCK CONVERTER

This application claims the benefit of Taiwan application Serial No. 93138184, filed Dec. 9, 2004, the subject matter of which is incorporated herein by reference.

BACKGROUND OF THE INVENTION

1. Field of the Invention

The invention relates in general to a buck converter, and more particularly to a synchronous buck converter capable of constraining a shoot-through voltage.

2. Description of the Related Art

Referring to FIG. 1, a circuit diagram of a conventional synchronous buck converter is shown. The synchronous buck converter 100 receives a first DC voltage Vin and outputs adjustable second DC voltage Vout accordingly. The synchronous buck converter 100 includes a first transistor Q1, a second transistor Q2, and a filter circuit 102. The first transistor Q1 has a drain D1 for receiving the first DC voltage Vin, a gate G1 for receiving a first control signal C1, and a source S1 coupled to a node N. The second transistor Q2 has a drain D2 coupled to the node N, a gate G2 for receiving a second control signal C2, and a source S2 coupled to a constant voltage, such as a ground voltage. The filter circuit 102 is coupled to the node N for filtering AC noise off the voltage at the node N and outputting the second DC voltage Vout accordingly.

Due to the gate-drain parasitic capacitor Cgd2 existing between the drain D2 and the gate G2, and the gate-source parasitic capacitor Cgs2 existing between the gate G2 and the source S2 of the second transistor Q2, a shoot-through voltage SV is generated at the gate G2 of the second transistor Q2 when the first transistor Q1 is turned on and the first DC voltage Vin is applied to the gate-drain parasitic capacitor Cgd2 and the gate-source parasitic capacitor Cgs2 via the first transistor Q1. Referring to FIG. 2, a wave pattern diagram of the voltage VG1 at the gate G1 and the voltage VG2 at the gate G2 in FIG. 1 is shown. It can be seen from FIG. 2 that when the first transistor Q1 is turned on, the first DC voltage Vin will generate a shoot-through voltage SV at the gate G2 of the second transistor Q2. Because channel resistance of the two transistors Q1 and Q2 is not large, they will be turned on simultaneously by the shoot-though voltage SV, larger than the threshold voltage of the second transistor Q2, and then be burned down by the first DC voltage Vin if serious.

A conventional method for solving the shoot-through voltage issue is connecting a capacitor Cadd in parallel to the gate-source parasitic capacitor Cgs2. The shoot-through voltage can be reduced as the first DC voltage Vin is divided by the capacitor Cadd, the gate-source parasitic capacitance Cgs2, and the gate-drain parasitic capacitor Cgd2. However, the extra capacitor Cadd will delay the time for turning on the second transistor Q2. Because the second control signal C2 charges the capacitor Cadd first, the switching loss of the second transistor Q2 will be increased and the efficiency of the synchronous buck converter 100 be reduced. Therefore, using an extra capacitor Cadd to solve the issue the first transistor Q1 and the second transistor Q2 are burned down by the shoot-through voltage will reduce the efficiency of the synchronous buck converter 100. For this reason, it becomes an essential subject for industrials to constrain the shoot-through voltage and increase the efficiency of the synchronous buck converter.

SUMMARY OF THE INVENTION

It is therefore an object of the invention to provide a buck converter in which the shoot-through voltage can be constrained and thus the device efficiency can be increased.

The invention achieves the above-identified object by providing a buck converter including a first transistor, a second transistor, a filter circuit, a capacitor and a switch. The first transistor has a drain for receiving a first DC voltage, a gate for receiving a first control signal, and a source coupled to a node. The second transistor has a drain coupled to the node, a gate for receiving a second control signal, and a source coupled to a constant voltage. The filter circuit is electrically coupled to the node for outputting a second DC voltage. The switch has a first terminal, a second terminal, and a control terminal. The first terminal is electrically coupled to the gate of the second transistor via the capacitor. The second terminal is electrically coupled to the source of the second transistor, and the control terminal receives the first control signal.

The switching speed of the switch is larger than the switching speed of the first transistor.

When the first control signal is enable, the first transistor and the switch are turned on, the capacitor is connected between the gate and the source of the second transistor, and the capacitance of the capacitor is chosen such that the shoot-through voltage at the gate of the second transistor generated by the first DC voltage is lower than the threshold voltage of the second transistor.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
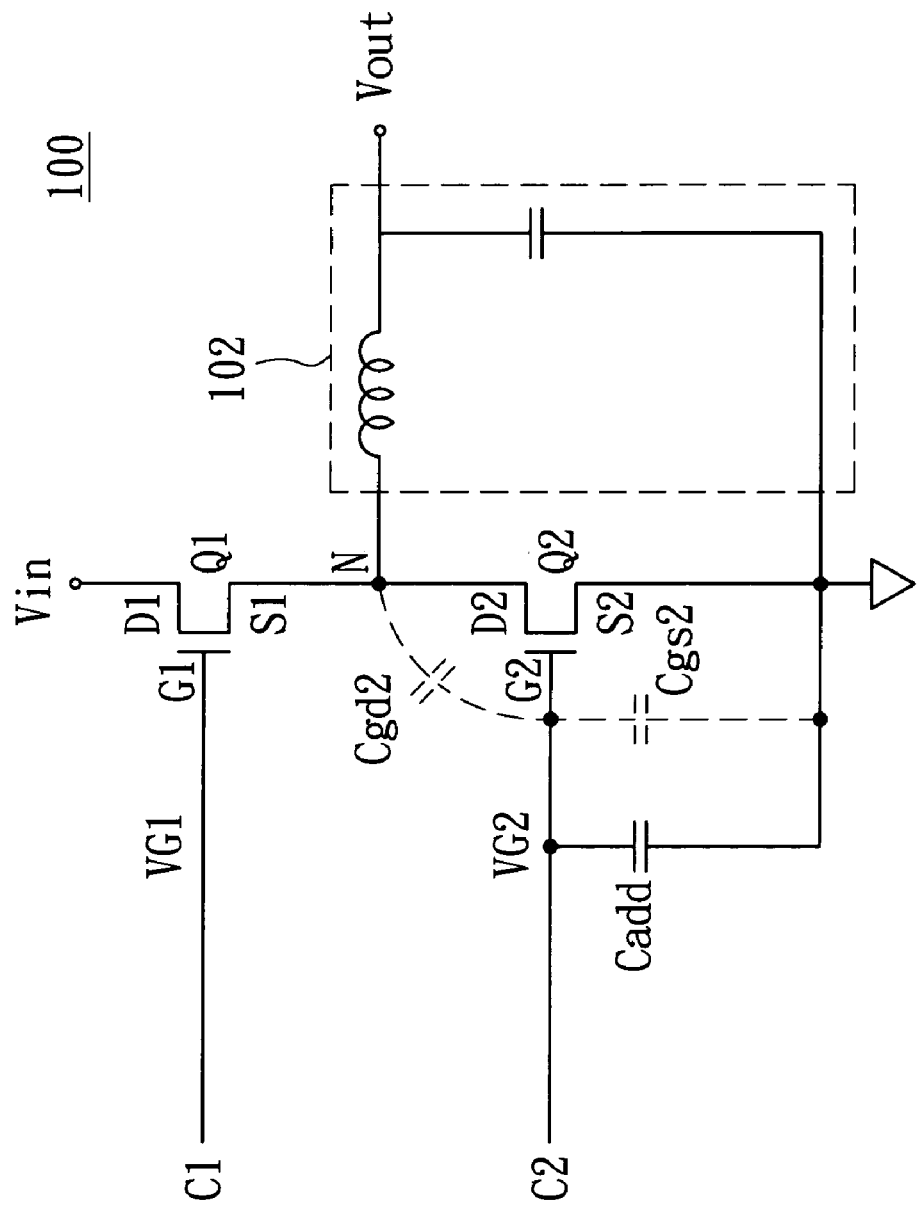
FIG. 1 (Prior Art) is a circuit diagram of a conventional synchronous buck converter.
Figure 2:
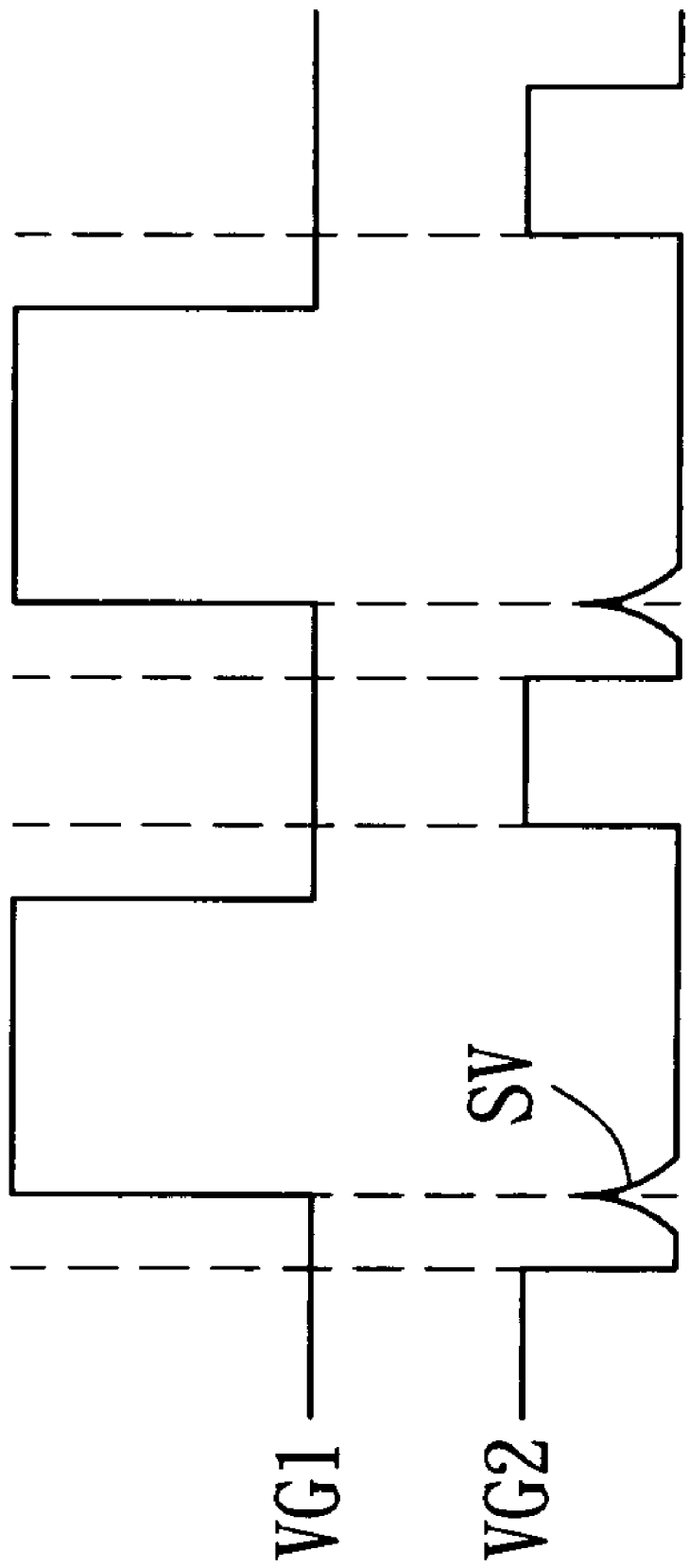
FIG. 2 (Prior Art) is a wave pattern diagram of the voltage VG1 at the gate G1 and the voltage VG2 at the gate G2 in FIG. 1.
Figure 3:
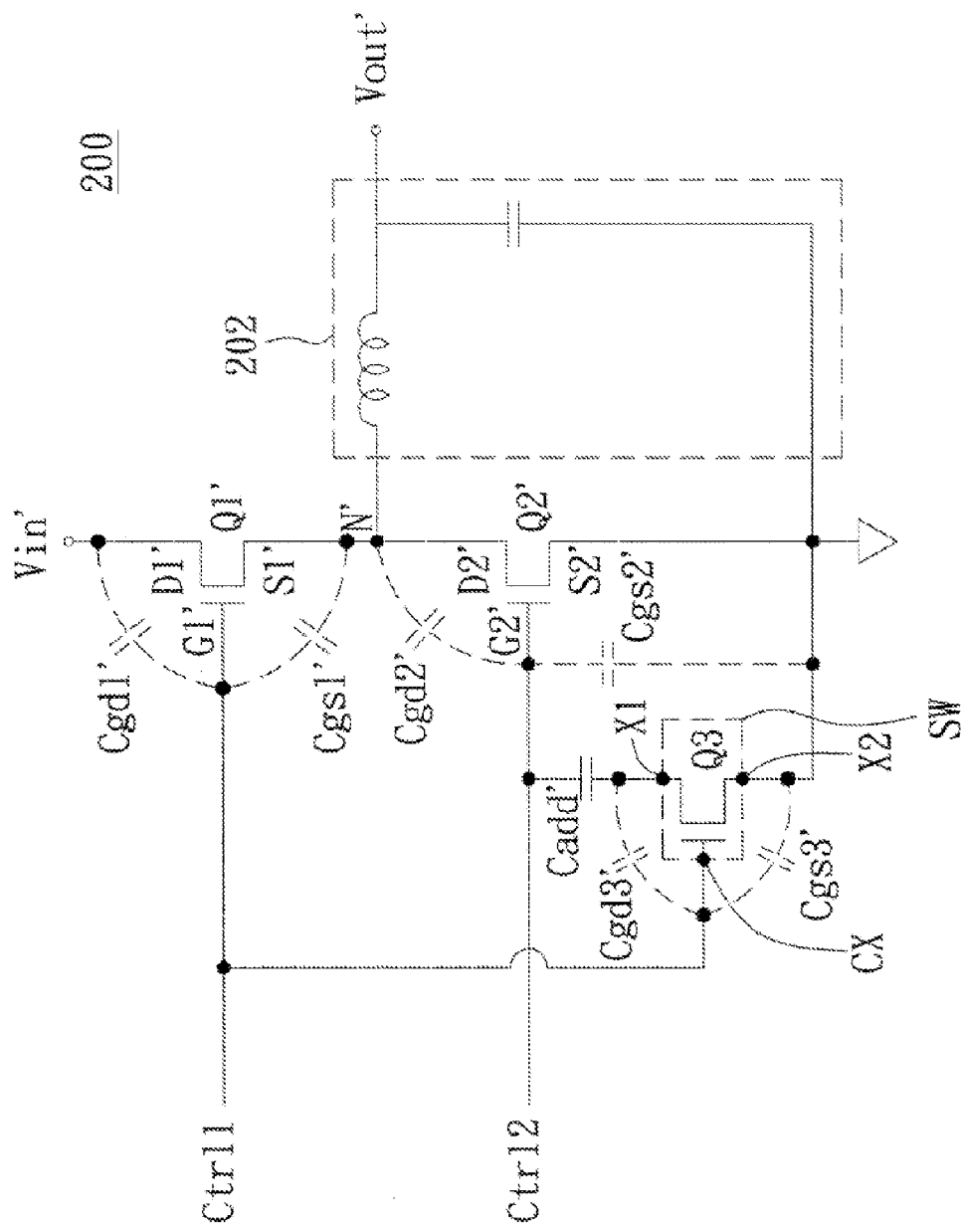
FIG. 3 is a circuit diagram of a buck converter according to a preferred embodiment of the invention.

Referring to FIG. 3, a circuit diagram of a buck converter according to a preferred embodiment of the invention is shown. The buck converter 200, such as a synchronous buck converter, includes a first transistor Q1', a second transistor Q2', a filter circuit 202, a capacitor Cadd', and a switch SW. The transistors Q1' and Q2' are N-type metal oxide semiconductor (NMOS) transistors for instance. The first transistor Q1' has a drain D1' for receiving the first DC voltage Vin, a gate G1' for receiving a first control signal Ctrl 1, and a source S1' coupled to a node N'.

The second transistor Q2' has a drain D2' coupled to the node N', a gate G2' for receiving a second control signal Ctrl 2, and a source S2' coupled to a constant voltage, such as a ground voltage. The filter circuit 202 is electrically coupled to the node N' for outputting a second DC voltage Vout'.

The switch SW has a first terminal X1, a second terminal X2 and a control terminal CX. The first terminal X1 is electrically coupled to the gate G2' of the second transistor Q2' via the capacitor Cadd'. The second terminal X2 is electrically coupled to the source S2' of the second transistor Q2' while the control terminal CX is for receiving the first control signal Ctrl 1. When the first control signal Ctrl 1 is enable, the first transistor Q1' and the switch SW are turned on and the capacitor Cadd' is connected between the gate G2' and the source S2' of the second transistor Q2'. The capacitance of the capacitor Cadd' is chosen such that the shoot-through voltage generated at the gate G2' of the second transistor Q2' by the first DC voltage Vin is lower than the threshold voltage of the second transistor Q2'.

Furthermore, the switch SW, such as a third transistor Q3, is turned on or turned off according to the first control signal Ctrl 1. For example, the transistor Q3 is a NMOS transistor, the first terminal X1 of the switch SW is the transistor's drain, the second terminal X2 of the switch SW is the transistor's source, and the control terminal CX of the switch SW is the transistor's gate. Through suitable design of the transistor Q3 and the first transistor Q1', the transistor Q3 can have a smaller parasitic capacitance formed by a gate-source parasitic capacitor Cgs3' and a gate-drain parasitic capacitor Cgd3', and thus the transistor Q3 has a faster switching speed than the first transistor Q1' which has a larger parasitic capacitance formed by a gate-source parasitic capacitor Cgs1' and a gate-drain parasitic capacitor Cgd1', as depicted in "Microelectronic circuits" by Adel S. Sedra, Kenneth C. Smith, New York, Oxford University Press, 2004. Therefore, when the first control signal Ctrl 1 is enable, the transistor Q3 is turned on and the capacitor Cadd' is connected in parallel between the gate G2' and the source S2' of the second transistor Q2' before the first transistor Q1' is turned on, thereby constraining the shoot-through voltage generated at the gate G2' of the second transistor Q2' as the first transistor Q1' is turned on.

Owing that the third transistor Q3 has a faster switching speed than the first transistor Q1', the third transistor Q3 is turned on by the first control signal Ctrl 1 faster than the first transistor Q1'. Therefore, when the first control signal is enable, the third transistor Q3 is turned on first to connect the capacitor Cadd' to the gate-source parasitic capacitor Cgs2' of the second transistor Q2' in parallel, thereby increasing the equivalent capacitance between the gate G2' and the source S2' of the second transistor Q2'. Consequently, when the first transistor Q1' is turned on later, the first DC voltage Vin is divided by the capacitor Cadd' and the gate-source parasitic capacitor Cgs2' so that the shoot-through voltage is reduced to be lower than the threshold voltage of the second transistor Q2' and the two transistors Q1' and Q2' are prevented from being burned down by the first DC voltage Vin.

When the second control signal Ctrl 2 is enable, the third transistor Q3 is turned off because the first control signal Ctrl 1 for controlling the third transistor Q3 is disable. At this time, the capacitor Cadd' is disconnected to the gate-source parasitic capacitor Cgs2', so the turn-on speed of the second transistor Q2' is not influenced by the capacitor Cadd'. Therefore, the conventional issue can be solved that the second control signal Ctrl 2 charges the capacitor Cadd' first causes the second transistor Q2' to have a higher switching loss and a slower turn-on speed and thus the synchronous buck converter 200 to have a lower efficiency.

Besides, a transistor, used as a switch, has usually switching loss due to the delayed turn-on/turn-off time of the transistor caused by its parasitic capacitance. In order to increase the efficiency of the synchronous buck converter 200, the parasitic capacitance of the first transistor Q1' has to be reduced to enhance its switching speed. However, this will increase the shoot-through voltage at the gate G2'.

According to the spirit of the invention, the shoot-through voltage can be constrained and thus the first transistor Q1' can be chosen to be a transistor having a faster switching speed than conventional one so as to increase the efficiency of the buck converter 200. For example, the first transistor Q1' can be a transistor labeled by S14392DY made by Siliconix and having a parasitic capacitance 1350 pF. The third transistor Q3 can be a transistor labeled by 2N7002E made by Siliconix and is chosen to have a parasitic capacitance smaller than 1350 pF, such as 30 pF, so that the transistor Q3 is turned on faster than the transistor Q1' as the first control signal Ctrl 1 is enable.

In the buck converter disclosed by the above-mentioned embodiment of the invention, the third transistor and a capacitor coupled in series are connected in parallel to the gate-source parasitic capacitor of the second transistor so that the shoot-through voltage generated at the gate of the second transistor can be constrained to be lower than the threshold voltage of the second transistor. Therefore, the two transistors Q1' and Q2' can be prevented from being burned down by the first DC voltage as turned on simultaneously and thus the efficiency of the buck converter 200 can be increased.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A buck converter, comprising:
    a first transistor, having a drain for receiving a first DC voltage, a gate for receiving a first control signal, and a source coupled to a node;
    a second transistor, having a drain coupled to the node, a gate for receiving a second control signal, and a source coupled to a constant voltage;
    a filter circuit, electrically coupled to the node for outputting a second DC voltage;
    a capacitor, and
    a switch, having a first terminal, a second terminal, and a control terminal, the first terminal electrically coupled to the gate of the second transistor via the capacitor, the second terminal electrically coupled to the source of the second transistor, the control terminal receiving the first control signal;
    wherein the first transistor has a first switching speed and the switch has a second switching speed; the second switching speed is faster than the first switching speed;
    wherein when the first control signal is enable, the first transistor and the switch are turned on, the capacitor is connected between the gate and the source of the second transistor, and the capacitance of the capacitor is chosen such that a shoot-through voltage at the gate of the second transistor generated by the first DC voltage is lower than a threshold voltage of the second transistor.

2. The buck converter according to claim 1, wherein the switch is a third transistor, a parasitic capacitance of the third transistor is smaller than a parasitic capacitance of the first transistor.

3. The buck converter according to claim 1, is a synchronous buck converter.

* * * * *